(12) United States Patent
Misawa et al.

(10) Patent No.: US 7,205,030 B2
(45) Date of Patent: Apr. 17, 2007

(54) METHOD FOR FORMING POROUS FILM (75) Inventors: Kaori Misawa, Ibaraki (JP); Isao Matsumoto, Kyoto (JP); Naofumi Ohashi, Tokyo (JP); Koichi Abe, Ibaraki (JP); Haruaki Sakurai, Ibaraki (JP)

(73) Assignee: Sanyo Electric Co., Ltd., Morigughi-Shi, Osaka (JP)

( * ) Notice: Subject to any disclaimer, the term of this patent is extended or adjusted under 35 U.S.C. 154(b) by 70 days.

(21) Appl. No.: 10/812,420

(22) Filed: Mar. 30, 2004

(65) Prior Publication Data

US 2004/0213911 A1  Oct. 28, 2004

(30) Foreign Application Priority Data

Apr. 2, 2003 (JP) ............................. 2003-099670

(51) Int. Cl.
*C05D 3/02* (2006.01)
(52) U.S. Cl. .................... 427/387; 528/481; 524/588
(58) Field of Classification Search ................. 427/387; 528/481; 524/588
See application file for complete search history.

(56) References Cited

U.S. PATENT DOCUMENTS

| | | |
|---|---|---|
| 6,342,454 B1 | 1/2002 | Hawker et al. |
| 2002/0132496 A1 | 9/2002 | Ball et al. |

FOREIGN PATENT DOCUMENTS

| | | | |
|---|---|---|---|
| EP | 0 997 497 A1 | | 5/2000 |
| EP | 1 142 832 A1 | | 10/2001 |
| EP | 1 260 991 A1 | | 11/2002 |
| JP | 2001-098218 | * | 4/2001 |
| JP | 2002-060691 | * | 2/2002 |

* cited by examiner

*Primary Examiner*—Kuo-Liang Peng
(74) *Attorney, Agent, or Firm*—Leydig, Voit & Mayer, Ltd.

(57) ABSTRACT

After applying a film-forming composition containing a polysiloxane, a pore-forming agent, an onium salt, and a solvent onto a semiconductor substrate, the solvent is evaporated from the film-forming composition in a first heat treatment. Then, a second heat treatment is carried out in an inert-gas atmosphere to promote the polymerization of the polysiloxane and thus form a polysiloxane resin film. Thereafter, a third heat treatment is carried out in an oxidizing-gas ambient to form pores in the polysiloxane resin film.

12 Claims, 5 Drawing Sheets

METHOD FOR FORMING POROUS FILM

BACKGROUND OF THE INVENTION

1. Field of the Invention

The present invention relates to a method for forming a porous film, and more specifically, a method for forming a porous film used in a semiconductor integrated circuit as a low-dielectric-constant film.

2. Background Art

In recent years, the speed of semiconductor devices has significantly increased, and concurrently, the problem of transmission delay due to a lowered signal propagation rate caused by wiring resistance and parasitic capacitance between wirings, or between wiring layers in multi-layer wiring portions has been growing. Since the wiring resistance elevates and parasitic capacitance increases with decrease in the wiring width and wiring distance accompanying the higher integration of semiconductor devices, such a problem tends to be increasingly significant.

Heretofore, in order to prevent signal delay due to increase in wiring resistance and parasitic capacitance, aluminum wirings have been substituted by copper wirings, and the use of materials for low-dielectric-constant insulating films as interlayer insulating films has been examined. For example, an SiOC (carbon doped silicon oxide) film formed by introducing methyl groups into an $SiO_2$ (silicon oxide) film, or organic insulating materials such as the film of polyallyl ether derivatives have been known. However, since the dielectric constant of these films are 2.6 to 2.9, the lowering of the dielectric constant has been demanded for semiconductor devices in the generation of the design rules for further miniaturization.

On the other hand, a film having pores of a diameter of several to hundreds of angstroms therein, known as a porous low-k film, is promising as a material to fabricate a next generation of integrated circuits.

Conventionally, a porous low-k film has been formed by applying a polysiloxane resin composition containing a pore-forming agent (porogen) onto a semi conductor substrate, and performing heat treatment to the polysiloxane resin composition. The heat treatment accelerates the curing reaction of polysiloxane, and at the same time, decomposes and evaporates the pore-forming agent. Thereby, a large number of fine pores are formed in the insulating film. At this time, if the decomposition of the pore-forming agent becomes vigorous before the curing reaction of polysiloxane ends, the size of formed pores becomes small, and pore-forming rate (porosity) lowers. Therefore, a conventional method is designed so that the decomposition of the pore-forming agent becomes vigorous at a temperature higher than the curing temperature of polysiloxane, and specifically, the polysiloxane resin composition has been heat-treated at a temperature of 425° C. or above to form pores therein.

However, there has been a problem that heat treatment at such a high temperature causes the reliability of copper wirings to lower. Therefore, there is an urgent need to lower the heat-treatment temperature. In this case, it is necessary to lower the decomposition reaction of the pore-forming agent as well as to lower the curing temperature of polysiloxane. Even if the lowering of the curing temperature of polysiloxane is realized, a large quantity of the pore-forming agent remains in the film if the decomposition and vaporization of the pore-forming agent is insufficient, and the porosity is lowered and the desired dielectric constant cannot be achieved.

SUMMARY OF THE INVENTION

The present invention has been devised to solve such problems. The object of the present invention is to provide a method for forming a porous film that can be used as a low-dielectric-constant insulating film.

Another object of the present invention is to provide a method for forming a porous film that can be used for manufacturing a highly reliable semiconductor device.

The other object and advantage of the present invention will be obvious from the following description.

According to one aspect of the present invention, in a method for forming a porous film, a film-forming composition containing a polysiloxane, a pore-forming agent, an onium salt, and a solvent is applied onto a substrate. A first heat-treatment is subjected for evaporating the solvent from said film-forming composition. A second heat-treatment is subjected for promoting the polymerization of the polysiloxane in an inert-gas atmosphere. A third heat-treatment is subjected for vaporizing the pore-forming agent in an oxidizing-gas atmosphere.

Other and further objects, features and advantages of the invention will appear more fully from the following description.

DETAILED DESCRIPTION OF THE PREFERRED EMBODIMENTS

The embodiments of the present invention will be described in detail below referring to the drawings.

A film-forming composition (silica-type resin composition) used in the present invention contains polysiloxane, a pore-forming agent, an onium salt, and a solvent.

As the polysiloxane, hydrolytic condensation product of compounds represented by the general formula (1) can be used.

[Formula 1]

(where R represents a hydrogen atom, or an organic group having 1 to 20 carbon atoms, X represents same or different hydrolysable groups, and n represents an integer from 0 to 2. When n is 2, R may be the same or different moieties.)

Examples of hydrolysable groups X in the general formula (1) include an alkoxy group, an alogen group, an acetoxy group, and an isocyanate group. Of these groups, an alkoxy group is preferably used from the point of view of the liquidity stability and coat-applying properties of the coat-forming composition.

Examples of compounds of which hydrolysable group X is an alkoxy group (alkoxysilanes) include tetraalkoxysilanes, such as tetramethoxysilane, tetraethoxysilane, tetra-n-propoxysilane, tetra-iso-propoxysilane, tetra-n-butoxysilane, tetra-sec-butoxysilane, tetra-tert-butoxysilane, and tetraphenoxysilane; trialkoxysilanes and dimethyldomethoxysilanes, such as trimethoxysilane, triethoxysilane, tripropoxysilane, fluorotrimethoxysilane, fluorotriethoxysilane, methyltrimethoxysilane, methyltriethoxysilane, methyltri-n-propoxysilane, methyltri-iso-propoxysilane, methyltri-n-butoxysilane, methyltri-iso-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-iso-butoxysilane, ethyltri-tert-butoxysilane, ethyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-iso-butoxysilane, n-propyltri-tert-butoxysilane, n-propyltriphenoxysilane, iso-propyltrimethoxysilane, iso-propyltriethoxysilane, iso-propyltri-n-propoxysilane, iso-propyltri-iso-propoxysilane, iso-propyltri-n-butoxysilane, iso-propyltri-iso-butoxysilane, iso-propyltri-tert-butoxysilane, iso-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-iso-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltri-iso-propoxysilane, sec-butyltri-n-butoxysilane, sec-butyltri-iso-butoxysilane, sec-butyltri-tert-butoxysilane, sec-butyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-iso-butoxysilane, t-butyltri-tert-butoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-iso-butoxysilane, phenyltri-tert-butoxysilane, phenyltriphenoxysilane, trifluorotrimethoxysilane, pentafluorotriethoxysilane, 3,3,3-trifluoropropyltrimethoxysilane, and 3,3,3-trifluoropropyltriethoxysilane; and diorganodialkoxysilanes, such as dimethyldimethoxysilane, dimethyldiethoxysilane, dimethyldi-n-propoxysilane, dimethyldi-iso-propoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldi-iso-propoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldi-iso-propoxysilane, di-n-propyldi-n-butoxysilane, di-n-propyldi-sec-butoxysilane, di-n-propyldi-tert-butoxysilane, di-n-propyldiphenoxysilane, di-iso-propyldimethoxysilane, di-iso-propyldiethoxysilane, di-iso-propyldi-n-propoxysilane, di-iso-propyldi-iso-propoxysilane, di-iso-propyldi-n-butoxysilane, di-iso-propyldi-sec-butoxysilane, di-iso-propyldi-tert-butoxysilane, di-iso-propyldiphenoxysilane, di-n-butyldimethoxysilane, di-n-butyldiethoxysilane, di-n-butyldi-n-propoxysilane, di-n-butyldi-iso-propoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldi-iso-propoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldi-iso-propoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldi-iso-propoxysilane, diphenyldi-n-butoxysilane, diphenyldi-sec-butoxysilane, diphenyldi-tert-butoxysilane, diphenyldiphenoxysilane, bis(3,3,3-trifluoropropyl)dimethoxysilane, and methyl(3,3,3-trifluoropropyl)dimethoxysilane.

Instead of the above-described alkoxysilanes, halogenosilanes wherein alkoxy is replaced by halogen; acetoxysilanes wherein alkoxy is replaced by acetoxy; and isocyanate silanes wherein alkoxy is replaced by isocyanate may also be used.

Furthermore, in the composition for film forming according to the present invention, the compounds represented by thegeneral formula (1) may be used alone, or in combination of two or more.

Examples of catalysts for accelerating reaction in the hydrolysis and condensation of compounds represented by the general formula (1) include organic acids, such as formic acid, maleic acid, fumaric acid, acetic acid, propionic acid, butanic acid, pentanic acid, hexanic acid, heptanic acid, octanic acid, nonanic acid, decanic acid, oxalic acid, adipic acid, sebacic acid, butyric acid, oleic acid, stearic acid, linoleic acid, linolenic acid, salicylic acid, benzoic acid, p-aminobenzoic acid, p-toluenesulfonic acid phthalic acid, sulfonic acid, tartaric acid, and trifluoromethane sulfonic acid; and inorganic acids, such as hydrochloric acid, phosphoric acid, nitric acid, boric acid, sulfuric acid, and hydrofluoric acid. From the point of view of the hardness and the dielectric constant of the cured film, maleic acid and nitric acid are preferable, and nitric acid is particularly preferable.

The above-described catalysts may be used alone, or in combination of two or more.

The quantity of the catalyst to be used is preferably within a range between 0.0001 and 1 mole to the compound represented by the general formula (1). If the quantity of the catalyst is excessively small, the polymerization reaction tends not to proceed. On the other hand, if the quantity of the catalyst is excessively large gelation tends to be accelerated.

Alcohol collaterally formed in the hydrolytic reaction may be removed using an evaporator or the like as required.

The quantity of water present in the hydrolysis and condensation reaction systems can be adequately determined; however, if the quantity is excessively small or excessively large, the film-forming property or the storage stability will be lowered. In the present invention, the quantity of water is preferably within a range between 0.5 and 20 moles to the compound represented by the general formula (1).

The weight-average molecular weight of polysiloxane formed by the hydrolysis and condensation of the compound represented by the general formula (1) is preferably within a range between 300 and 20,000, and more preferably within a range between 500 and 10,000 from the point of view of solubility in the solvent, mechanical properties, and film-forming properties. Here, the weight-average molecular weight is a value measured using gel permeation chromatography (GPC), and converted using the working curve of reference polystyrene.

In the present invention, the carbon content of polysiloxane is preferably 11% or less, more preferably 10.4% or less, further preferably 9.6% or less, and most preferably 8.8% or less. The lower limit of the carbon content of polysiloxane is about 6%. The carbon content exceeding 11% is not preferable because the adhesiveness and mechanical strength of the finally obtained porous film (silica-type resin film) having siloxane skeletons are lowered.

The above-described carbon content is calculated assuming that the state wherein siloxane has been completely condensed and cured. For example, in the case of a copolymer of tetraalkoxysilane and methyl trialkoxysilane, the condensed and cured product of tetraalkoxysilane is assumed as $SiO_2$, and the condensed and cured product of methyl trialkoxysilane is assumed as $CH_3SiO_{1.5}$. The carbon content is calculated as the quotient obtained by dividing the product of the atomic weight of carbon and the molar fraction of $CH_3SiO_{1.5}$ by the product of the molar fraction of $SiO_2$ and the molecular weight of $SiO_2$ plus the product of the molar fraction of $CH_3SiO_{1.5}$ and the molecular weight of $CH_3SiO_{1.5}$. Specifically, it is calculated using the following equation.

Carbon content={(12.011×mole fraction of $CH_3SiO_{1.5}$)/(mole fraction of $SiO_2$×molecular weight of $SiO_2$+mole fraction of $CH_3SiO_{1.5}$× molecular weight of $CH_3SiO_{1.5}$)}×100

In the present invention, the composition for forming a film contains a solvent that can dissolve compounds represented by the general formula (1). Examples of such solvents include ether acetate-type solvents, such as ethylene glycol methylether propionate ethylene glycol ethylether propionate, ethylene glycol methylether acetate, ethylene glycol ethylether acetate, diethylene glycol methylether acetate, diethylene glycol ethylether acetate, diethylene glycol n-butylether acetate, propylene glycol methylether acetate, propylene glycol ethylether acetate, propylene glycol propylether acetate, dipropylene glycol methylether acetate, and dipropylene glycol ethylether acetate; ether glycol-type solvents, such as ethylene glycol monomethylether, ethylene glycol monoethylether, ethylene glycol mono-n-hexylether, ethylene glycol monophenylether, ethylene glycolmono-2-ethylether, propyleneglycolmonomethylether, propylene glycol monoethylether, propylene glycol monopropylether, diethylene glycol monoethylether, diethylene glycol mono-n-butylether, diethylene glycol mono-n-hexylether, dipropylene glycol monomethylether, and dipropylene glycol monoethylether; alcohol-type solvents, such as methanol, ethanol, n-propanol, iso-propanol, n-butanol, iso-butanol, sec-butanol, t-butanol, n-pentanol, iso-pentanol, 2-methylbutanol, sec-pentanol, t-pentanol, 3-methoxybutanol, n-hexanol, 2-methylpentanol, sec-hexanol, 2-ethylbutanol, sec-heptanol, n-octanol, 2-ethylhexanol, sec-octanol, n-nonyl alcohol, n-decanol, sec-undecyl alcohol, trimethylnonyl alcohol, sec-tetradecyl alcohol, sec-heptadecyl alcohol, phenol, cyclohexanol, methyl cyclohexanol, benzyl alcohol, ethylene glycol, 1,2-propylene alcohol, 1,3-propylene alcohol, diethylene glycol, dipropylene glycol, triethylene glycol, and tripropylene glycol; ketone-type solvents, such as acetone, methyl ethyl ketone, methyl n-propylketone, methyln-butylketone, methyliso-butylketone, methyl n-pentyl ketone, methyl n-hexyl ketone, diethyl ketone, di-iso-butyl ketone, trimethyl nonanone, cyclohexanone, cyclopentanone, methylcyclohexanone, 2,4-pentandione, acetonylacetone, diacetone alcohol, acetophenone, and γ-butylolactone; ether-type solvents, such as ethyl ether, 1-propyl ether, n-butyl ether, n-hexyl ether, 2-ethylhexyl ether, ethylene oxide, 1,2-propylene oxide, dioxolane, 4-methyl dioxolane, dioxane, and dimethyl dioxane; ester-type solvents, such as methyl acetate, ethyl acetate, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, nonyl acetate, γ-butyrolactone, γ-valerolactone, methyl diacetate, ethyl acetoacetate, glycol diacetate, methoxytriglycol acetate, ethyl propionate, n-butyl propionate, iso-amyl propionate, diethyl oxalate, di-n-butyl oxalate, methyl lactate, ethyl lactate, n-butyl lactate, and n-amyl lactate; alkylene glycol dialkyl ether-type solvents, such as ethylene glycol dimethyl ether, triethylene glycol dimethyl ether, ethylene glycol diethyl ether, and ethylene glycol dibutyl ether; dialkylene glycol dialkyl ether-type solvents, such as diethylene glycol dimethyl ether and diethylene glycol diethyl ether; and acetonitrile, N,N-dimethyl formamide, N,N-dimethyl acetamide, and N,N-dimethyl sulfoxide. Especially from the point of view of the mechanical properties and electrical properties of the film, a type of solvents, such as alkylene glycol dialkyl ether or dialkylene glycol dialkyl ether is preferable; and diethylene glycol dialkyl ether-type solvents, such as diethylene glycol dimethyl ether and diethylene glycol diethyl ether are more preferable. These solvents may be used alone, or in combination of two or more. It is preferable that the quantity of the solvent to be used is that the quantity of the siloxane oligomer is within a range between 3% by weight and 25% by weight. If the quantity of the solvent is excessively small, the stability, film-forming properties and the like of the composition tend to lower. On the other hand, if the quantity of the solvent is excessively large, the desired film thickness tends to be difficult to obtain.

In the present invention, the film-forming composition contains a pore-forming agent (porogen). The weight reduction of the pore-forming agent in nitrogen at 250° C. to 400° C. is preferably 95% by weight or more, more preferably 97% by weight or more, and further preferably 99% by weight or more. If the weight reduction is less than 95% by weight, the pore-forming agent, a part thereof, or compounds derived from the pore-forming agent may remain in the film consisting of a siloxane resin formed by heat-curing the film-forming composition (silica-type resin film). The presence of the residues thereof is not preferable because they lead to the deterioration of electrical properties, such as the elevation of the specific dielectric constant.

Here, the weight reduction of the pore-forming agent can be measured, for example, using the following instruments and conditions.

Instrument: TG/DTS 6300 (manufactured by Seiko Instruments Inc.)
Temperature of temperature raising starting: 50° C.
Temperature raising rate: 10 degrees/min
Quantity of the sample: 10 mg
Atmosphere: Nitrogen, flow rate: 200 ml/min
Reference: α-alumina (manufactured by Seiko Instruments Inc.)
Sample container: aluminum open sample pan φ5 (manufactured by Seiko Instruments Inc.)

In the above-described measurement, the reference weight before the decomposition of the compound can be the weight at 150° C. on the way of temperature raising. In this case, weight reduction at 150° C. or below is caused by the removal of adsorbed water and the like, which is the cause other than the pyrolysis of the pore-forming agent.

Examples of pore-forming agents used in the present invention include vinyl ether-type compounds, vinyl pyridine-type compounds, styrene-type compounds, alkyl ester vinyl-type compounds, (meth)acrylate-type compounds, and polymers having an alkylene oxide structure. From the point of view of the decomposition properties of the polymer and the mechanical strength of the film, the polymers having an alkylene oxide structure is preferable, and the polymers having a propylene oxide structure is particularly preferable.

Examples of pore-forming materials used in the present invention include polyethylene oxides, polypropylene oxides, polytetramethylene oxides, and polybutylene oxides. Specific examples are ether-type compounds, such as polyethylene oxide alkyl ether, polyoxyethylene sterol ether, polyoxyethylene lanoline derivatives, the ethylene oxide derivatives of alkyl phenol-formaldehyde condensation products, polyoxyethylene-polyoxypropylene block copolymers, polyoxypropylene oxide alkyl ethers, and polyoxyethylene-polyoxypropylene alkyl ethers; ether ester-type compounds, such as polyoxyethylene glycerin fatty acid ester, polyoxyethylene sorbitol fatty acid ester, polyoxyethylene fatty acid alkanolamide sulfates, polyethylene glycol fatty acid ester, ethylene glycol fatty acid ester, fatty acid monogliceride, polyglicerin fatty acid ester, sorbitan fatty acid ester, and polyethylene glycol fatty acid ester; and glycol-type compounds, such as ethylene glycol, diethylene glycol, triethylene glycol, propylene glycol, polyethylene glycol, and polypropylene glycol.

The weight-average molecular weight of the pore-forming agent used in the present invention is preferably 200 to 10,000, more preferably 300 to 5,000, and further preferably 400 to 2,000, from the point of view of solubility in the solvent, miscibility to polysiloxane, and mechanical properties and forming properties of the film. Here, the weight-average molecular weight is a value measured using gel permeation chromatography (GPC), and converted using the working curve of reference polystyrene.

In the present invention, the film-forming composition contains an onium salt. Examples of onium salts include ammonium salts, phosphonium salts, arsonium salts, stibonium salts, oxonium salts, sulfonium salts, selenoniumsalts, stannoniumsalts, and iodonium salts. Among these salts, ammonium salts are preferable from the point of view of the stability of the composition. Examples of the ammonium salts include tetramethylammonium hydroxide, tetramethylammonium chloride, tetramethylammonium bromide, tetramethylammonium fluoride, tetrabutylammonium hydroxide, tetrabutylammonium chloride, tetrabutylammonium bromide, tetrabutylammonium fluoride, tetramethylammonium nitrate, tetramethylammonium acetate, tetramethylammonium propionate, tetramethylammonium maleate, and tetramethylammonium sulfate. Of these salts, tetramethylammonium nitrate, tetramethylammonium acetate, tetramethylammonium propionate, tetramethylammonium maleate, and tetramethylammonium sulfate are preferable from the point of view of the electrical properties of the porous film.

The proportion of the onium salt to be used to the total quantity of the film-forming composition is preferably 0.001 ppm to 5%, more preferably 0.01 ppm to 2%, and further preferably 0.1 ppm to 1%. If the quantity of the onium salt to be used is excessively small, the electrical properties and mechanical properties of the finally obtained porous film tend to lower. On the other hand, if the quantity of the onium salt is excessively large, the stability and film-forming properties of the film-forming composition, and the electrical properties and process compatibility of the film tend to lower. The onium salt may be added after diluting with water or other solvents as required.

The pH of the aqueous solution of the onium salt is preferably 1.5 to 10, more preferably 2 to 8, and further preferably 3 to 6. If the pH is excessively high or excessively low, the stability and film-forming properties of the film-forming composition tend to lower.

In the present invention, it is not preferable that the film-forming composition contains much alkali metals and alkali earth metals. Specifically, the contents of these elements in the film-forming composition is preferably 100 ppb or less, and more preferably 20 ppb or less. If much ions of alkali metals or alkali earth metals are contained, the ions flow into semiconductor elements; and device performance may be adversely affected. The alkali metals and alkali earth metals can be removed using an ion-exchange filter or the like as required.

Next, the method for forming a porous film according to the present invention will be described. The method for forming a porous film of the present invention comprises steps of: coating the above-described film-forming composition on the substrate, a first heat-treatment for evaporating the solvent from the film-forming composition, a second heat-treatment for promoting the polymerization of the polysiloxane in an inert-gas atmosphere, and a third heat-treatment for vaporizing the pore-forming agent in an oxidizing-gas atmosphere.

Figure 1A:
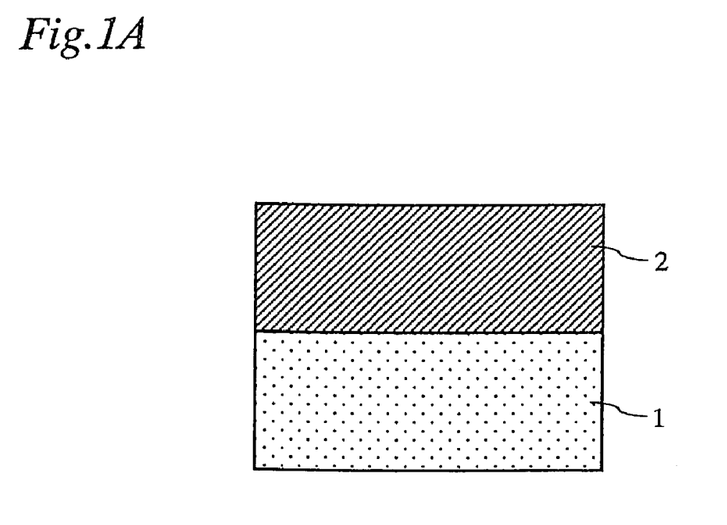
FIGS. 1A~1D show a method for forming a porous film according to the present invention.

FIGS. 1A~1D are a schematic diagram of the method for forming a porous film in this embodiment. First, as FIG. 1A shows, a film-forming composition 2 is applied onto a semiconductor substrate 1 using a spin-coating method or the like.

As the semiconductor substrate, for example, a silicon substrate can be used. The silicon substrate may have an element-isolating region or diffusion layers to be a source and a drain formed thereon. A gate electrode may also be formed on the silicon substrate.

Figure 1B:
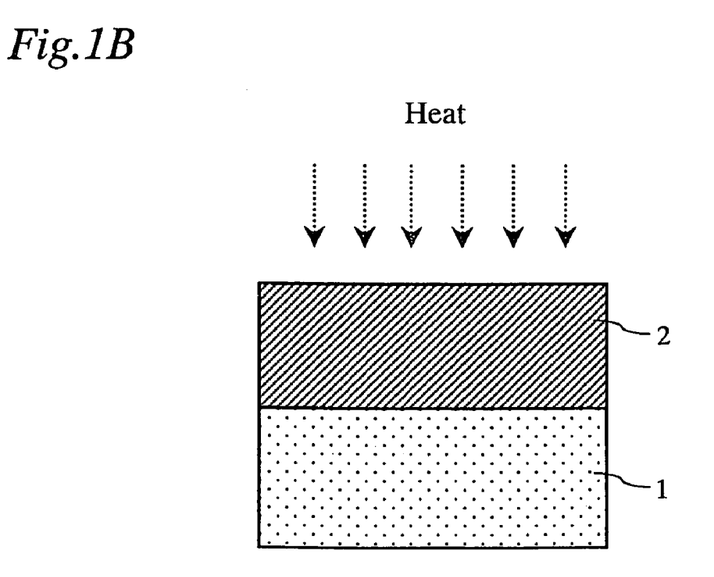

Next, as FIG. 1B shows, a first heat-treatment step is carried out. This step is carried out to evaporate off the solvent contained in the film-forming composition. Although the heating temperature can be suitably set depending on the type of the solvent, it is preferably a temperature of the decomposing temperature of the pore-forming agent or below. Specifically the temperature is preferably 350° C. or below, and more is preferably 250° C. or below.

It is also preferable that the first heat-treatment step is carried out in an inert-gas atmosphere to inhibit the decomposition of the pore-forming agent. As the inert gas, for example, nitrogen ($N_2$), helium (He), or Argon (Ar) can be used. In this case, it is preferable that the content of oxygen contained in the atmosphere is as low as possible, and when the oxygen content is 100 ppm or less, a porous film having favorable properties can be obtained.

Figure 1C:
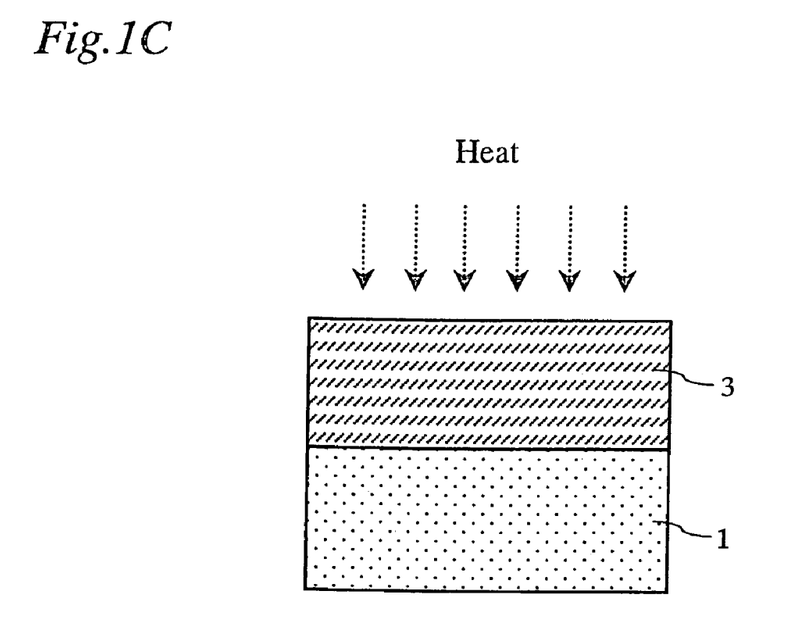

After the completion of the first heat-treatment step, the second heat-treatment step is carried out as FIG. 1C shows. In this step, the curing of polysiloxane is promoted, and a polysiloxane resin film 3 is formed.

The purpose of the second heat treatment step is to accelerate polysiloxane to form the film, and the heat treatment is performed at a temperature higher than the temperature of the first heat treatment. At this time, the heat treatment is performed so as to make the pore-forming agent retain in the film without vaporizing. In this case, although the decomposition reaction of the pore-forming agent may occur, the decomposition products are made to retain in the film without vaporizing. Specifically, the heat treatment is performed in an atmosphere of an inert gas, such as nitrogen ($N_2$), helium (He), or Argon (Ar), at a temperature of 400° C. or below, preferably 350° C. or below. The oxygen content in the atmosphere is preferably as low as possible, and specifically, 10 ppm or less.

Figure 1D:
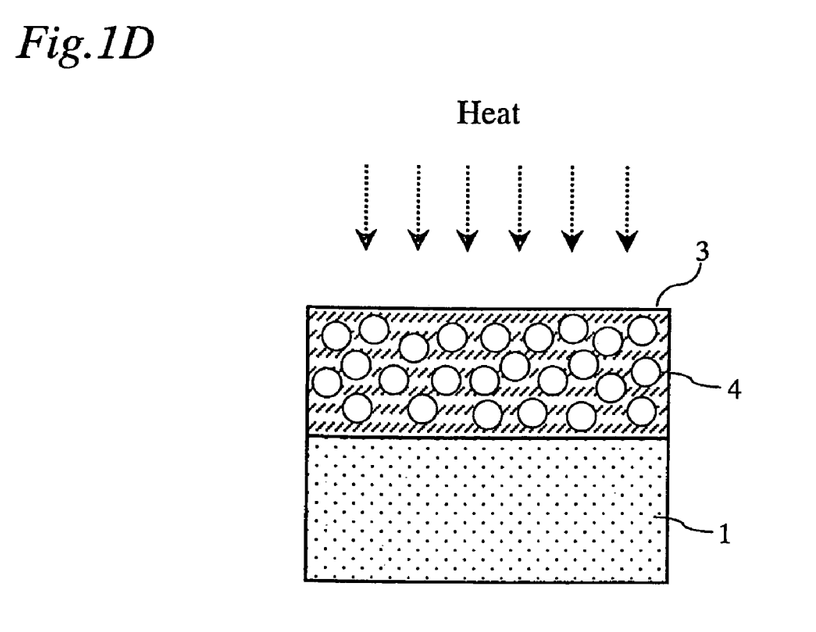

After the completion of the second heat treatment step, the third heat treatment step is performed as FIG. 1D shows. The purpose of this step is to positively decompose and vaporize the pore-forming agent retained in the cured polysiloxane resin film. By extracting the vaporized pore-forming agent from the polysiloxane skeleton, a large number or pores 4 can be formed in the polysiloxane resin film 3.

Specifically, the heat treatment is performed in an oxidizing-gas atmosphere at a temperature of 400° C. or below, preferably 350° C. or below. By heating the polysiloxane resin coat 3 in an oxidizing-gas atmosphere, the decomposition and vaporization of the pore-forming agent can be accelerated, and thereby the heating temperature in this step can be lowered. Here, as the oxidizing gas, oxygen gas or a gas containing oxygen. The oxygen gas may contain ozone or oxygen radicals. Although the heating temperature may be the same as the temperature in the second heat treatment step, the temperature is preferably lower than the temperature in the second heat treatment step in order to manufacture a high-reliability semiconductor device. It is the matter of course that the temperature is higher than the temperature in the first heat treatment step.

In the present invention, the first heat treatment step, the second heat treatment step, and the third heat treatment step can be carried out using a hot plate, a furnace, or the like.

By the above-described steps, a porous film having a desired dielectric constant can be formed on a semiconductor substrate. By using the porous film, for example, as an interlayer insulating film, and forming contacts, wirings and the like according to known methods, a semiconductor device having an insulating film of a low dielectric constant can be manufactured.

For comparison, the case wherein the formation of a film and the removal of the pore-forming agent after the heat treatment for the removal of the solvent are performed in a single step will be described referring to FIGS. 2A~2C.

Figure 2A:
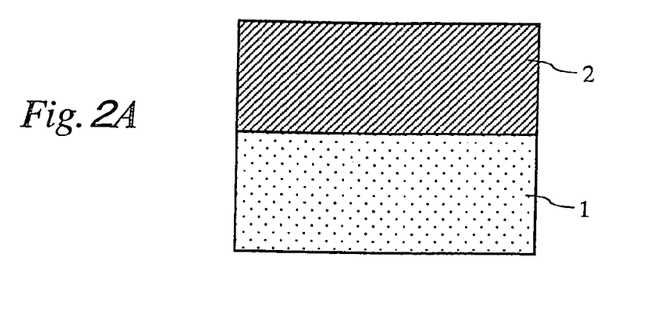
FIGS. 2A~2C show a method for forming a porous film according to the comparative example.
Figure 2B:
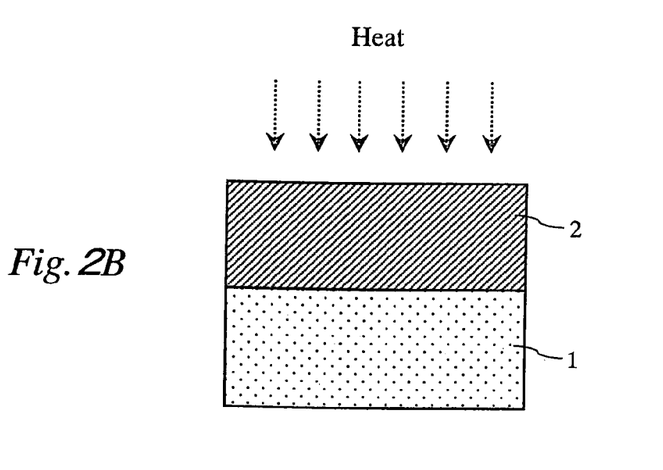

First, in the same manner as in FIG. 1A, a film-forming composition 2 is applied onto a semiconductor substrate 1 (FIG. 2A). Next, in the same manner as in FIG. 1B, heat treatment is performed to remove the solvent from the film-forming composition 2 (FIG. 2B). Thereafter, as FIG. 2C shows, heat treatment is performed in an inert-gas atmosphere. Thereby, the curing of polysiloxane is promoted to form a polysiloxane resin film 5, and pores 6 are formed in the polysiloxane resin film 5 as well.

Figure 2C:
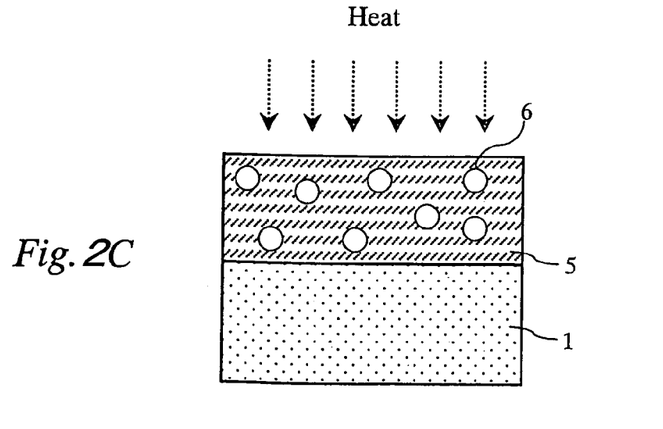

The purpose of the heat treatment shown in FIG. 2C is to simultaneously perform the polymerization reaction of polysiloxane, and the decomposition and the vaporization of the pore-forming agent. In this case, if the heat treatment temperature is 400° C. or below; the pore-forming agent is retained in the polysiloxane resin film, and pore formation is lowered. For example, if the heat treatment is performed at 350° C. for 5 minutes, the number of pores formed in the polysiloxane resin film 5 (FIG. 2C) is smaller than the number of pores in FIG. 1D. Therefore, in order to form a porous film having a desired dielectric constant, heat treatment at a temperature as high as 400° C., or for a long time is required, leading to the lowering of the reliability of the semiconductor device.

Further for comparison, the case wherein the heat treatment is performed in an oxygen atmosphere will be described referring to FIGS. 3A~3D.

Figure 3A:
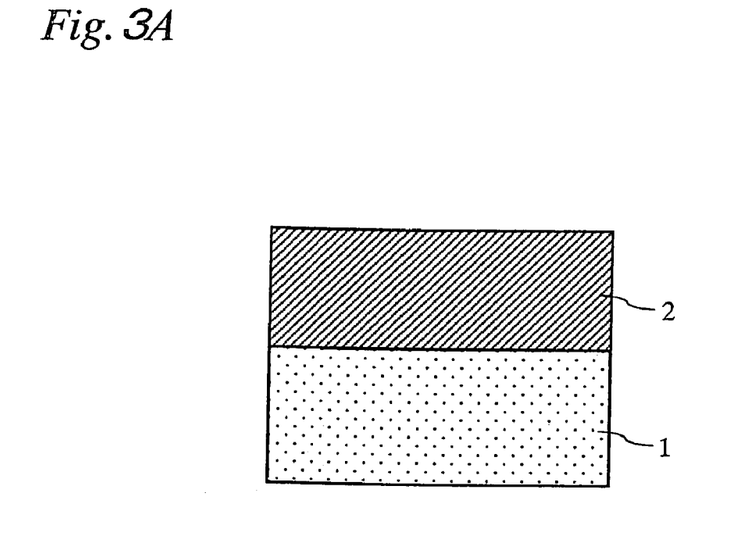
FIGS. 3A~3D show a method for forming a porous film according to the comparative example.
Figure 3B:
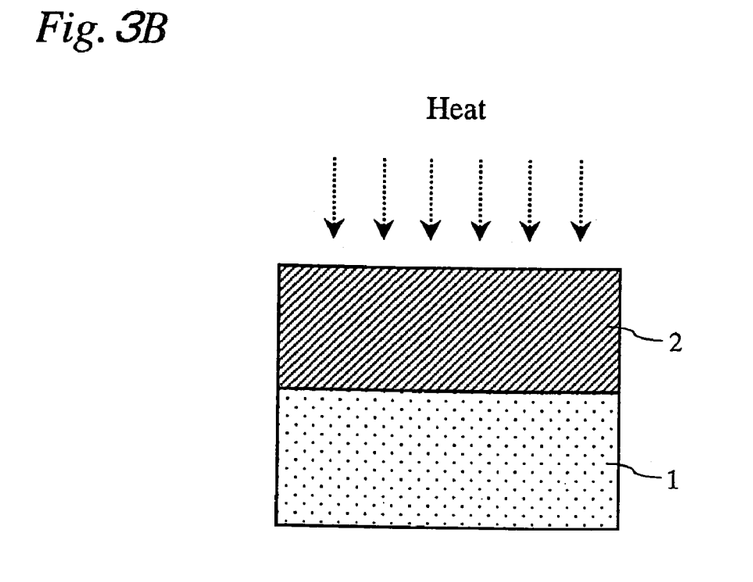
Figure 3C:
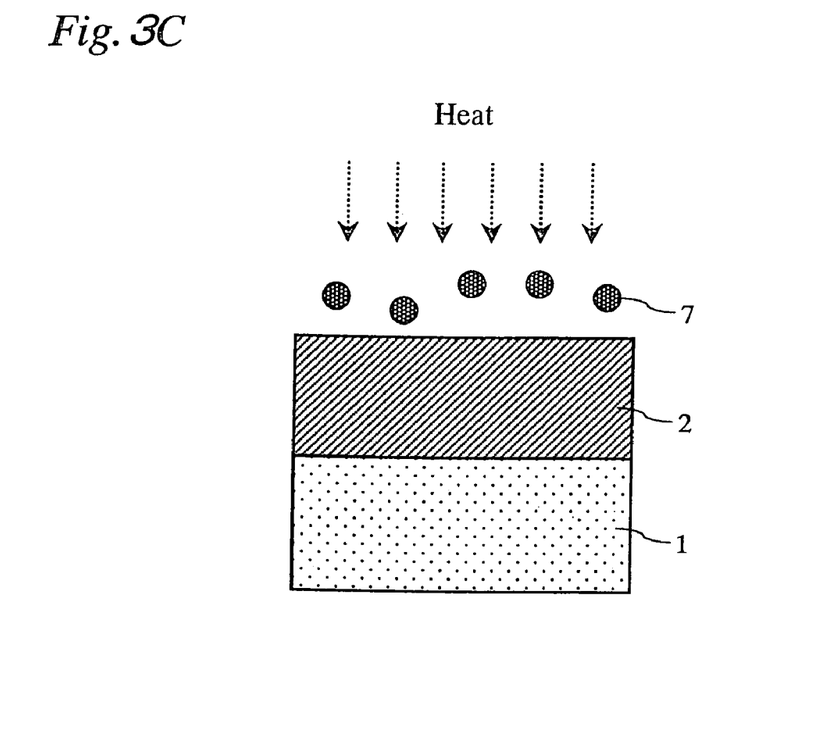
Figure 3D:
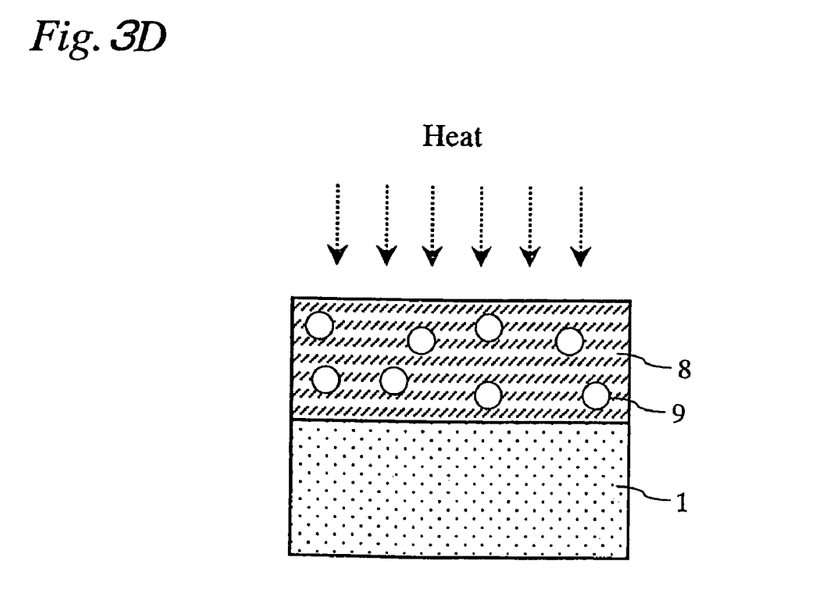

First, in the same manner as in FIG. 1A, a film-forming composition 2 is applied onto a semiconductor substrate 1 (FIG. 3A). Next, in the same manner as in FIG. 1B, heat treatment is performed to remove the solvent from the film-forming composition 2 (FIG. 3B). Thereafter, as FIG. 3C shows, heat treatment is performed in an oxygen gas atmosphere at a temperature of 400° C. or below. Since the decomposition and vaporization of the pore-forming agent is more active in the oxygen gas atmosphere, the pore-forming agent 7 is partially decomposed and vaporized in the initial stage of heating, before the film is formed, as shown in FIG. 3C. In such a case, since no pores will be formed later, the number of pores 9 in the finished polysiloxane resin coat 8 should be smaller than the number of pores seen in FIG. 1D, as shown in FIG. 3D. This means that a lower porosity produced in the polysiloxane resin film 8 will not yield a desirable dielectric constant thereof. By-products (not shown) produced by the rapid decomposition of the pore-forming agent may remain in the polysiloxane resin film 8 causing the dielectric constant to elevate.

According to this embodiment, since the step for curing polysiloxane and the step for removing the pore-forming agent are separated, and the pore-forming agent is decomposed and vaporized after the film is formed, a porous film having a large number of pores can be formed. Therefore, the use of the porous film as the interlayer insulating film can significantly reduces the parasitic capacitance on the semiconductor device, and can restrain signal delay due to the miniaturization of devices.

Also according to this embodiment, since the pore-forming agent is decomposed and vaporized in an oxygen atmosphere, a lower heating temperature can be used. Thereby, a semiconductor device having high-reliability copper wirings can be manufactured.

Although this embodiment has been described referring to an example using a film-forming composition that contains polysiloxane, a pore-forming agent, an onium salt, and a solvent, the present invention is not limited thereto. The present invention can be applied to any method as long as a porous film is formed by heat-curing a resin that contains a pore-forming agent.

EXAMPLES

Preparation of Film-forming Composition

In a 1,000-ml flask, 135.0 g of tetraethoxysilane and 109.1 g of methyl triethoxysilane were charged, 475.7 g of diethylene glycol diethyl ether was added thereto, and these were agitated and mixed at a speed of rotation of 200 rpm at normal temperature. To the obtained solution, a solution prepared by dissolving 0.51 g of maleic acid in 79.7 g of water was dropped in 30 minutes while agitating. During dropping, although the temperature of the solution was elevated due to heat generation, the solution was allowed to stand as it is without cooling with cooling water or the like. After the completion of dropping, and allowing the solution to react, a solution of polypolysiloxane was obtained. At this time, the temperature of the solution lowered to nearly normal temperature. The polypolysiloxane solution was placed in a hot bath of a temperature of 75 to 85° C., sucked under a reduced pressure to distill out part of ethanol formed during the hydrolysis reaction and diethylene glycol diethyl ether used as the solvent, and 500.0 g of a condensed polysiloxane solution was obtained.

The weight-average molecular weight of the obtained polysiloxane measured using the gel permeation chromatography (GPC) method was 1,150.

Next, 481.3 g of the above-described condensed polysiloxane solution was charged in a 1,000-ml flask, 23.0 g of polypropylene glycol monobutyl ether, as a pore-forming agent; 16.2 g of a 2.38% aqueous solution of tetramethylammonium acetate, as an onium salt; and 479.6 g of diethylene glycol diethyl ether, as a solvent were added, and the mixture was agitated at room temperature for 30 minutes to dissolve. Thereby the film-forming composition was prepared. The weight-average molecular weight of polypropylene glycol monobutyl ether measured using the gel permeation chromatography (GPC) method was 400, and the weight loss at 350° C. in a nitrogen atmosphere was 99.9%. The pH of the aqueous solution of tetramethylammonium acetate was 4.0.

Formation of Porous Film

The prepared film-forming composition was applied onto a silicon substrate. As the coater, ACT 12-SOD manufactured by Tokyo Electron Ltd. was used. The rotation speed for coating was 800 rpm, the atmospheric temperature in the cup was 23° C., and the relative humidity in the cup was 45%. After the removal of the edge, NMP (N-methyl-2-pyrrolidinone) was used as a cup-rinse liquid and a back-rinse liquid.

Next, a heat treatment was performed using a hot plate in a nitrogen atmosphere at 250° C. for 3 minutes. The hot plate used was a low-oxygen-content high-temperature hot-plate station, equipped with ACT 12-SOD manufactured by Tokyo Electron Ltd. The oxygen content in the atmosphere was 100 ppm or lower.

Then, a heat treatment was performed using a hot plate in a nitrogen atmosphere at 350° C. for 5 minutes. The flow rate of nitrogen gas was made to be 40 L/min, and the oxygen content in the atmosphere was made to be 10 ppm or lower.

Finally, a heat treatment was performed using a hot plate in the atmosphere at 350° C. for 5 minutes to form a porous film consisting of a polysiloxane resin.

The relative dielectric constant of the obtained porous film was determined at 2.45, indicating that the porous film could be satisfactorily used as a low-dielectric-constant insulating film. The determination was performed using a mercury probe system manufactured by Four Dimension by applying varying voltages ranging from −80 V to +80 V to the polysiloxane resin film about 250 nm in thickness and then by calculating the relative dielectric constant from the obtained capacitances.

The hardness of the polysiloxane resin films of a thickness of 250 nm and a thickness of 500 nm was measured using a triboscope manufactured by Hysitron Inc. The obtained values were comparative to the value of a porous film formed be a conventional method, and the polysiloxane resin films had a satisfactory level of mechanical strength for manufacturing a semiconductor device.

Comparative Example 1

In the same manner as in the example, the film-forming composition prepared in the example was applied onto a silicon substrate.

Next, in the same manner as in the example, a heat treatment was performed using a hot plate in a nitrogen atmosphere at 250° C. for 3 minutes.

Finally, a heat treatment was performed using-a hot plate in a nitrogen atmosphere at 350° C. for 5 minutes. The flow rate of nitrogen gas was made to be 40 L/min, and the oxygen content in the atmosphere was made to be 10 ppm or lower.

The dielectric constant of the obtained porous film measured in the same manner as in the example was 2.95.

Comparative Example 2

In the same manner as in the example, the film-forming composition prepared in the example was applied onto a silicon substrate.

Next, in the same manner as in the example, a heat treatment was performed using a hot plate in a nitrogen atmosphere at 250° C. for 3 minutes.

Finally, a heat treatment was performed using a hot plate in an oxygen atmosphere at 350° C. for 5 minutes.

The dielectric constant of the obtained porous film measured in the same manner as in the example was 2.95.

The features and advantages of the present invention may be summarized as follows.

According to one aspect, an insulating film with a lowered dielectric constant can be provided, resulting in a significant reduction in parasitic capacitance of semiconductor devices and inhibition of signal delay due to miniaturization of devices.

According to another aspect, since the heat-treatment temperature can be lowered, a semiconductor device that excels in reliability can be manufactured.

Obviously many modifications and variations of the present invention are possible in the light of the above teaching. It is therefore to be understood that within the scope of the appended claims the invention may be practiced otherwise than as specifically described.

The entire disclosure of a Japanese Paten Application No. 2003-099670, filed on Apr. 2, 2003 including specification, claims, drawings and summary, on which the Convention priority of the present application is based, are incorporated herein by reference in its entirety.

What is claimed is:

1. A method of forming a porous film comprising:
applying a film-forming composition containing a polysiloxane, a pore-forming agent, an onium salt, and a solvent onto a substrate,
evaporating said solvent from said film-forming composition in a first heat treatment,
promoting polymerization of said polysiloxane in an inert-gas atmosphere in a second heat treatment, and
vaporizing said pore-forming agent in an oxidizing-gas ambient in a third heat treatment at a temperature that is lower than the temperature of the polymerization-promoting second heat treatment.

2. The method of forming a porous film according to claim 1, including evaporating the solvent in the first heat-treatment in an inert-gas atmosphere at a temperature not exceeding 350° C.

3. The method of forming a porous film according to claim 1, including promoting polymerization in the second heat-treatment at a temperature not exceeding 400° C.

4. The method of forming a porous film according to claim 1, including promoting polymerization in the second heat-treatment at a temperature not exceeding 350° C.

5. The method of forming a porous film according to claim 1, wherein said oxidizing-gas ambient includes oxygen.

6. The method of forming a porous film according to claim 5, wherein said oxygen contains one of ozone and oxygen radicals.

7. The method of forming a porous film according to claim 1, wherein said polysiloxane is a hydrolytic condensation product of a compound represented by the general formula (1):

$$R_nSiX_{4-n} \quad (1)$$

wherein R represents a hydrogen atom or an organic group having from 1 to 20 carbon atoms, X represents hydrolysable groups which may be the same as or different from each other, and n represents an integer from 0 to 2, with the proviso that when n is 2, R may be the same or different moieties.

8. The method of forming a porous film according to claim 7, wherein the weight-average molecular weight of said polysiloxane ranges from 300 to 20,000.

9. The method of forming a porous film according to claim 1, wherein said pore-forming agent is a polymer having an alkylene-oxide structure with a weight-average molecular weight of from 200 to 10,000.

10. The method of forming a porous film according to claim 1, wherein said onium salt is an ammonium salt.

11. The method of forming a porous film according to claim 1, wherein said solvent is selected from the group consisting of an alkylene glycol dialkyl ether and a dialkylene glycol dialkyl ether.

12. The method of forming a porous film according to claim 1, wherein said substrate is a semiconductor substrate.

* * * * *